(12) United States Patent
Loubet et al.

(10) Patent No.: US 10,205,022 B2
(45) Date of Patent: *Feb. 12, 2019

(54) METHOD OF MAKING A SEMICONDUCTOR DEVICE USING SPACERS FOR SOURCE/DRAIN CONFINEMENT

(71) Applicant: STMICROELECTRONICS, INC., Coppell, TX (US)

(72) Inventors: Nicolas Loubet, Guilderland, NY (US); Pierre Morin, Albany, NY (US)

(73) Assignee: STMicroelectronics, Inc., Coppell, TX (US)

( * ) Notice: Subject to any disclaimer, the term of this patent is extended or adjusted under 35 U.S.C. 154(b) by 9 days.

This patent is subject to a terminal disclaimer.

(21) Appl. No.: 14/939,729

(22) Filed: Nov. 12, 2015

(65) Prior Publication Data

US 2016/0064566 A1 Mar. 3, 2016

Related U.S. Application Data

(63) Continuation of application No. 13/905,586, filed on May 30, 2013, now Pat. No. 9,219,133.

(51) Int. Cl.
| | |
|---|---|
| *H01L 29/78* | (2006.01) |
| *H01L 29/165* | (2006.01) |
| *H01L 29/66* | (2006.01) |
| *H01L 27/088* | (2006.01) |
| *H01L 21/02* | (2006.01) |
| *H01L 29/06* | (2006.01) |

(52) U.S. Cl.
CPC ...... *H01L 29/7848* (2013.01); *H01L 27/0886* (2013.01); *H01L 29/165* (2013.01); *H01L 29/66795* (2013.01); *H01L 21/0262* (2013.01); *H01L 21/02532* (2013.01); *H01L 21/02576* (2013.01); *H01L 21/02579* (2013.01); *H01L 29/0673* (2013.01); *H01L 29/66439* (2013.01)

(58) Field of Classification Search
CPC .................................................. H01L 29/66795
See application file for complete search history.

(56) References Cited

U.S. PATENT DOCUMENTS

| | | | |
|---|---|---|---|
| 6,787,854 B1 | 9/2004 | Yang et al. | |
| 8,313,999 B2 * | 11/2012 | Cappellani | H01L 21/26506 257/E21.421 |
| 9,219,133 B2 * | 12/2015 | Loubet | H01L 29/66795 |
| 2004/0262688 A1 * | 12/2004 | Nowak | H01L 27/1203 257/350 |
| 2008/0303114 A1 | 12/2008 | Shibata et al. | |

(Continued)

FOREIGN PATENT DOCUMENTS

CN 102656672 A 9/2012

*Primary Examiner* — Alexander Ghyka
(74) *Attorney, Agent, or Firm* — Seed Intellectual Property Law Group LLP

(57) ABSTRACT

A method of making a semiconductor device includes forming a first spacer for at least one gate stack on a first semiconductor material layer, and forming a respective second spacer for each of source and drain regions adjacent the at least one gate. Each second spacer has a pair of opposing sidewalls and an end wall coupled thereto. The method includes filling the source and drain regions with a second semiconductor material while the first and second spacers provide confinement.

22 Claims, 8 Drawing Sheets

(56) References Cited

U.S. PATENT DOCUMENTS

| | | |
|---|---|---|
| 2009/0152589 A1 | 6/2009 | Rakshit et al. |
| 2010/0203732 A1 | 8/2010 | Doris et al. |
| 2012/0142121 A1 | 6/2012 | Khare et al. |
| 2012/0252174 A1 | 10/2012 | Dutartre et al. |
| 2013/0052801 A1 | 2/2013 | Berliner et al. |
| 2013/0115759 A1 | 5/2013 | Park et al. |

* cited by examiner

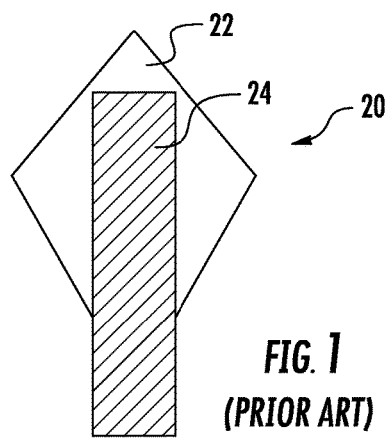
FIG. 1
(PRIOR ART)
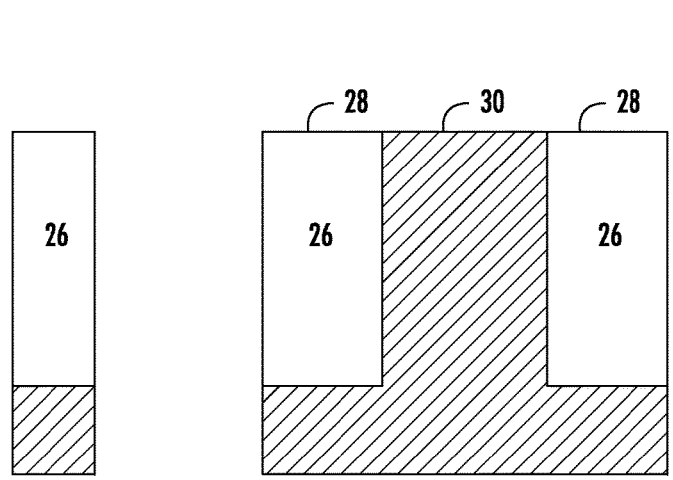
FIG. 2  FIG. 3
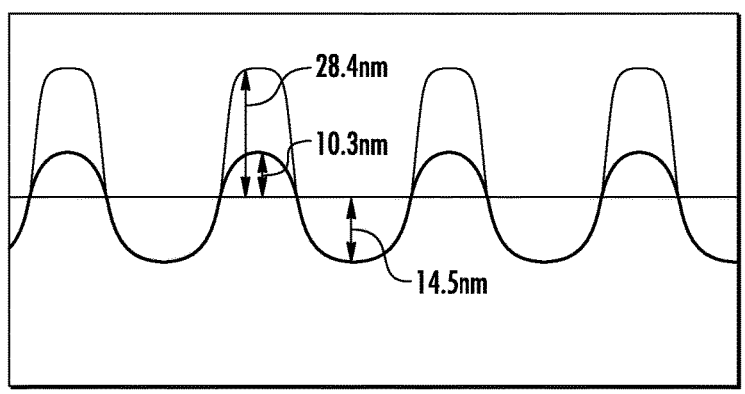
FIG. 4
(PRIOR ART)

METHOD OF MAKING A SEMICONDUCTOR DEVICE USING SPACERS FOR SOURCE/DRAIN CONFINEMENT

FIELD OF THE INVENTION

The present invention relates to electronics, and more particularly, to a method of making semiconductor devices.

BACKGROUND OF THE INVENTION

Semiconductor device technologies continue to evolve, providing higher chip density and operating frequencies. Fin-type field-effect transistors (FinFETs) are one type of transistor technology that is currently used to help provide desired device scaling while maintaining appropriate power consumption budgets.

This fin-type field effect transistor (FinFET) is a transistor that is formed within a fin of material. A fin is a relatively narrow width, relatively tall height structure that protrudes from the top surface of a substrate. The fin width is intentionally kept small to limit the short channel effect. In many FinFet's, a fin cap is positioned on the top of the fin and runs along the fin length. The fin cap has a fin cap width equal to the fin width, and fin cap height that is less than the fin height.

In a conventional FinFET, a gate conductor is positioned on the top surface of the substrate and over a portion of the fin. The gate conductor runs parallel to the top of the substrate and is perpendicular to the fin length such that the gate conductor intersects a portion of the fin. An insulator (e.g., gate oxide) separates the gate conductor from the fin and the fin cap. Further, the region of the fin that is positioned below the gate conductor comprises a semiconductor channel region. The FinFET structure can include multiple fins and fin caps, in which case the gate conductor would wrap around, as well as fill in, the space between these fins.

During FinFET formation, source and drain recesses are formed and typically require additional cleanings to have epitaxial regrowth above the fin at the source and drain regions. Some epitaxial junctions formed by this epitaxial regrowth are stressed. During manufacture, it is difficult to make a uniform fin recess dimension when multiple fins are used and epitaxial junctions are stressed. Also, during manufacture, the fin profile is often rounded and the fin surface is damaged by aggressive reactive ion etching (RIE) after spacer formation, and during in-situ doped epitaxy. These factors may impact adversely transistor functionality.

SUMMARY OF THE INVENTION

A method of making a semiconductor device comprises forming a first spacer for at least one gate stack on a first semiconductor material layer. The method further comprises forming a respective second spacer for each of source and drain regions in the first semiconductor layer and adjacent the at least one gate, with each second spacer comprising a pair of opposing side walls and an end wall coupled thereto. The method further comprises filling the source and drain regions with a second semiconductor material while the first and second spacers provide confinement.

The method may comprise etching source and drain recesses adjacent the at least one gate stack prior to filling. The etching and filling may be performed in a same processing chamber, for example. In another example, the method may comprise shaping the source and drain regions to have an inclined extension adjacent the at least one gate stack. The first and second spacers may comprise a nitride, such as SiN, for example.

The first and second semiconductor materials may be formed of different semiconductor materials so that stress is imparted to a channel region under the at least one gate stack. The first semiconductor material may comprise silicon, and the second semiconductor material may comprise silicon and germanium. The first semiconductor layer comprises a silicon on insulator (SOI) wafer. The method may further comprise forming a plurality of fins, and forming the second spacers on outer surfaces of the fins and adjacent the at least one gate stack. The fins are etched to form source and drain recesses in an example.

BRIEF DESCRIPTION OF THE DRAWINGS

Other features and advantages of the present invention will become apparent from the detailed description of the invention which follows, when considered in light of the accompanying drawings in which:

FIG. 1 is a fragmentary diagram of a prior art FinFET structures showing an embedded epitaxial area adjacent the fin as in the prior art.

FIGS. 2 and 3 are fragmentary diagrams of a FinFET device showing embedded epitaxial source and drain regions as in the present invention.

FIG. 4 is a graph showing a fin profile in an example FinFET device as in the prior art.

DETAILED DESCRIPTION OF THE EMBODIMENTS

Figure 5:
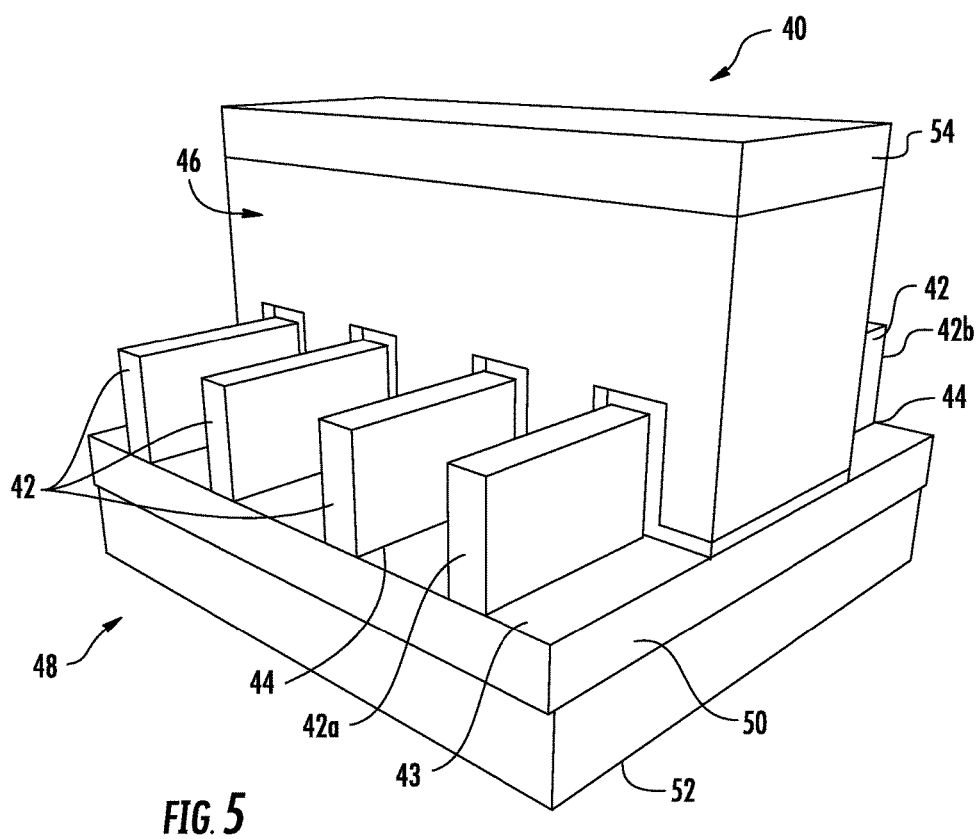
FIG. 5 is a perspective view of a semiconductor device as a FinFET device in accordance with a non-limiting example of the present invention and showing a first processing step of patterning and etching to form silicon fins.

Different embodiments will now be described more fully hereinafter with reference to the accompanying drawings, in which preferred embodiments are shown. Many different forms should not be construed as limited to the embodiments set forth herein. Rather, these embodiments are provided so that this disclosure will be thorough and complete, and will fully convey the scope to those skilled in the art.

FIG. 1 is fragmentary diagram of a prior art semiconductor device as a FinFET structure 20 that includes an epitaxial regrowth 22 above the fin 24. This type of device may be limited in performance. In contrast, FIGS. 2 and 3 illustrate a modified FinFET structure 25, where device functionality is enhanced by embedding an epitaxial regrowth 26 into the fin source and drain regions 28 after etching along the fin 30. The embedded epitaxial junctions may be potentially stressed when fins are formed by partial anisotropic reactive ion beam (RIE) etching after spacer formation, followed by in-situ doped epitaxy. The epitaxial material may be either n-type or p-type doped silicon, or silicon germanium (SiGe), or silicon carbon (SiC), for imparting stress and enhanced mobility. SiGe is used for compressive stress of a channel (pFET), while SiC is used for tensile stress for nFET transistor improvements.

FIG. 4 shows a sectional view of an image of an example FinFET device showing the pitch-to-pitch profile and relative dimensions of the FinFET profile as a non-limiting example. The profile shown in FIG. 4 is a prior art example of a rounded fin profile that may have been damaged, such as by aggressive reactive ion beam etching processes, requiring additional cleaning of the surfaces.

It may be difficult to have a uniform fin, pitch-to-pitch profile when fins are rounded and a fin surface has been damaged by aggressive reactive ion beam etching processes, thereby requiring additional processing and cleaning to make the surface cleaner prior to epitaxial regrowth. The fin also may have been recessed outside the spacers and additional implants may be needed to build the junctions as extensions.

A method in accordance with a non-limiting example of the present embodiments overcomes these disadvantages and provides epitaxial source and drain regions that are formed by in-situ HCL (hydrochloric acid) etching of at least one silicon fin, followed by epitaxial regrowth of the in-situ doped Si, SiGe, or SiC. SiN spacers can confine the stressor material as an epitaxial material and minimize subsequent doping dose losses. For that reason, implants may not be needed. The HCL etch process is more isotropic and a good profile containing the (111) facet (plane) is achieved for maximum stress and device improvement.

The method in accordance with a non-limiting example of the present embodiments has advantages such as limiting damage of the fin during recess etching. This processing may be accomplished in-situ in a clean environment and a single processing tool may be used, such as an epitaxial reactor in one non-limiting example. There may be no requirements for additional cleanings after recess formation. The chemically pure surface leads to excellent crystalline quality of the grown layer, such as any SiGe or SiC layers. There is no epitaxial overgrowth 22 as shown in the prior art device of FIG. 1 because material is confined by the SiN spacer material in all directions, forming a square configuration as illustrated in FIGS. 2 and 3. There may be no need for additional implants that would reduce the stress and damage the silicon. Also, junctions may be engineered directly via in-situ doped epitaxy. Dopants may be boron, phosphorous, arsenic and other similar dopants depending on the type of transistor, such as nFET or pFET.

FIGS. 5-13 illustrate a method of forming a semiconductor device, such as a FinFET, in accordance with a non-limiting example with FIGS. 5-7 and 11 showing various isometric views in different stages of processing and FIGS. 8-10 and 12 showing cross-sectional views during different stages of processing.

FIG. 5 is an isometric view of a semiconductor device as a FinFET device illustrated generally at 40 in a first stage of processing and showing a plurality of semiconductor fins 42 extending upwardly from a first semiconductor material layer 43 as a substrate and being spaced apart along the substrate. Each semiconductor fin has opposing first and second ends 42a, 42b and forming respective source and drain regions 44 and a medial portion therebetween. At least one gate stack 46 is formed over the medial portions of the semiconductor fins 42 on the first semiconductor material layer. In one example, the first semiconductor layer is formed as a silicon on insulator (SOI) wafer 48 with a $SiO_2$ layer 50 over a silicon substrate 52 as illustrated. A hard mask 54 protects the top surface of the gate stack 46 and comprises a silicon nitride material, and in one example, is 30 nm (nanometers) thick.

Figure 6:
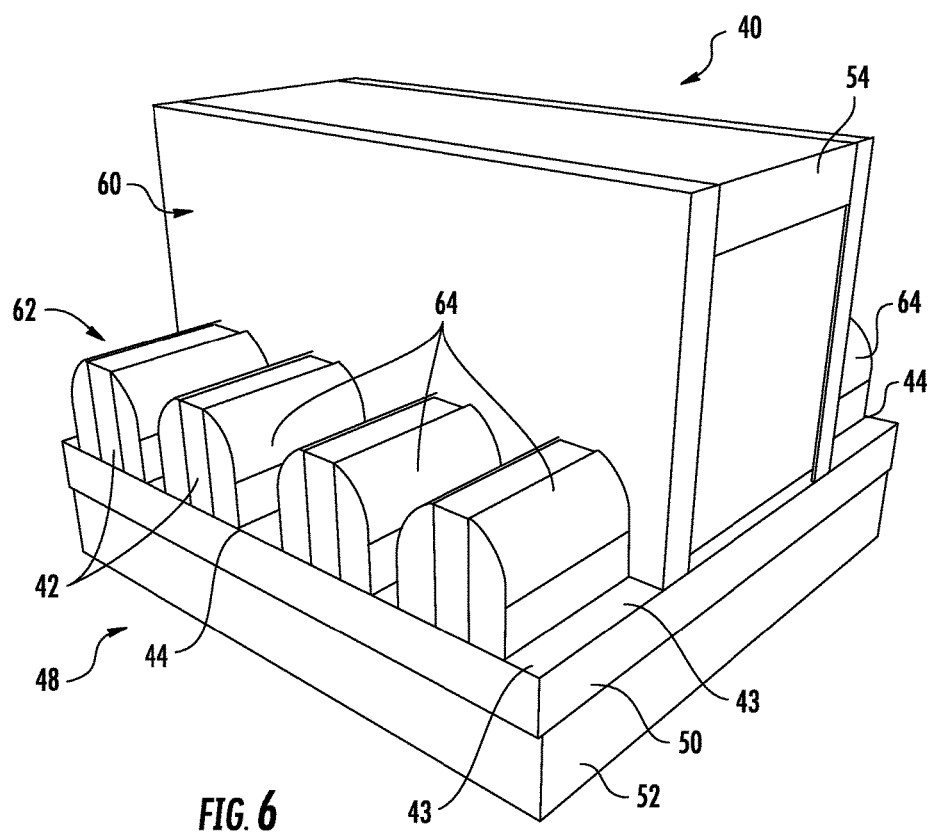
FIG. 6 is another perspective view similar to FIG. 5 and showing a second processing step of forming first and second SiN spacers, including each of source and drain regions and on outer surfaces of each semiconductor fin.
Figure 8:
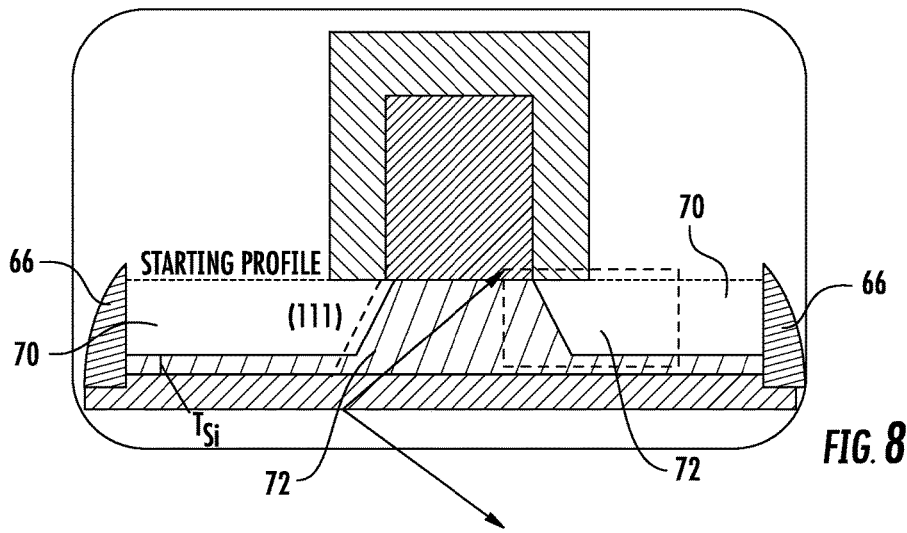
FIG. 8 is a cross-sectional view taken along line 8-8 of FIG. 7 and showing the profile of source and drain recesses after etching.

FIG. 6 shows a further processing step of applying a first SiN spacer 60 for the at least one gate stack 46 on the first semiconductor material layer 43 and a second respective SiN spacer 62 for each of the source and drain regions 44 in the first semiconductor material layer 43 and adjacent the at least one gate with each second SiN spacer comprising a pair of opposing sidewalls 64 and an end wall 66 shown in FIG. 8 coupled thereto.

Figure 7:
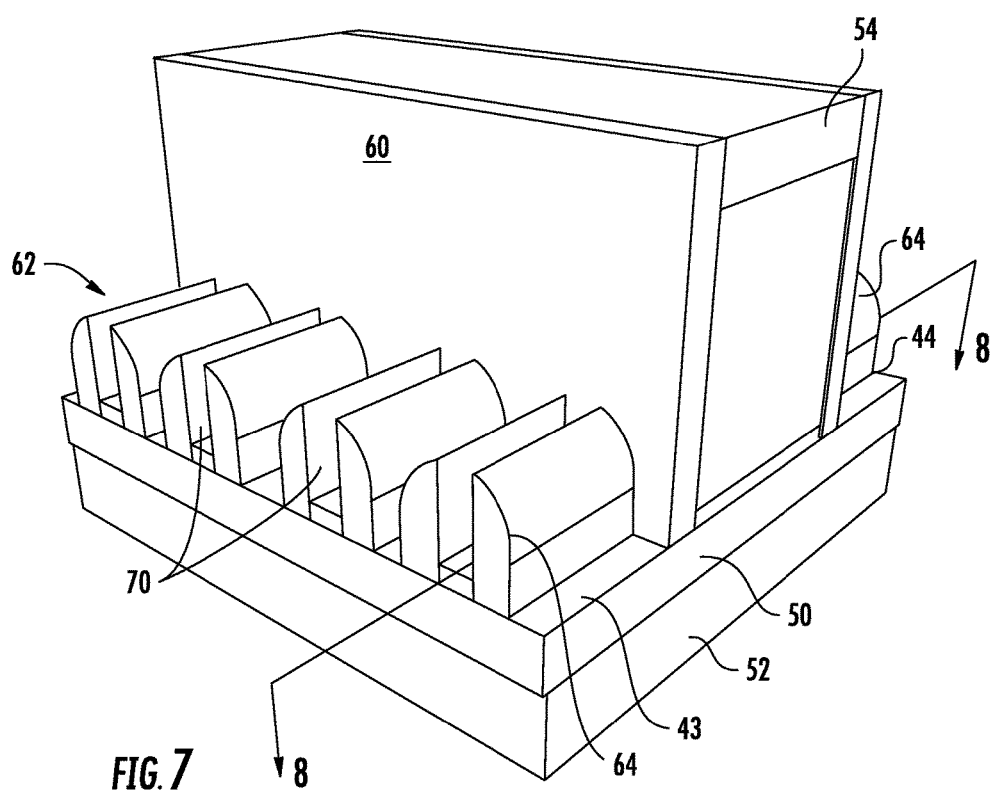
FIG. 7 is another perspective view showing a third processing step of etching the silicon fins to form source and drain recesses at the respective source and drain regions.

FIG. 7 shows a further processing step in which the silicon fins 42 are etched with a vapor phase HCL in one example to form source and drain recesses 70 adjacent the at least one gate stack 46 at each of the source and drain regions 44 as illustrated.

Figure 9:
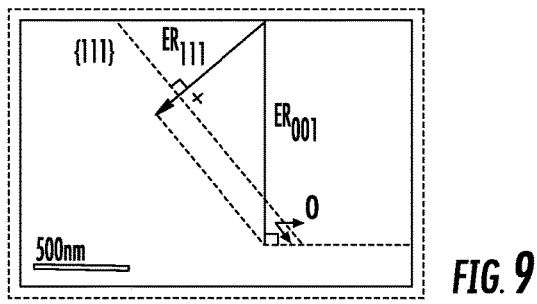
FIG. 9 is a sectional image of the inclined extension shown by the area of the dashed lines in FIG. 8 and showing the facet (plane) profile and respective angles.
Figure 10:
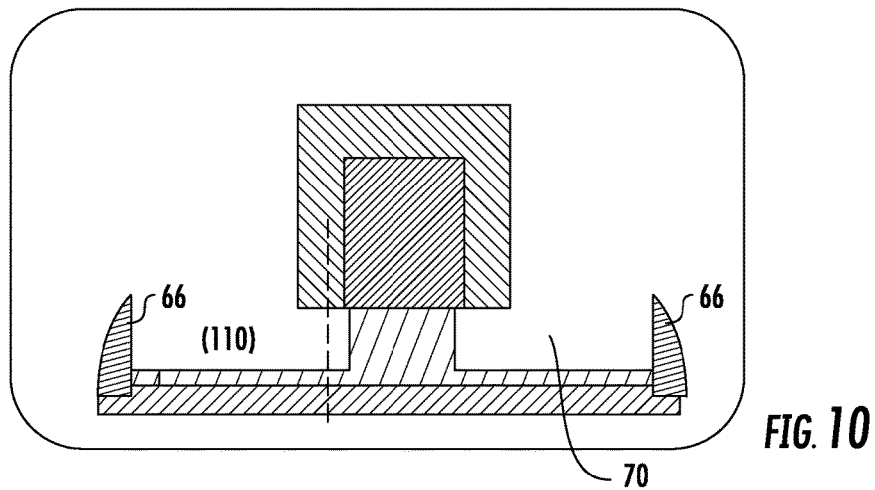
FIG. 10 is another cross-sectional view similar to FIG. 8 but showing the substrate rotated.

FIG. 8 is a cross-sectional view taken along line 8-8 of FIG. 7 and shows the fin profile after the HCL etching to form the source and drain recesses 70. The source and drain recesses 70 have an inclined extension 72 adjacent the at least one gate stack 46 as shown in FIG. 8 and in the image of FIG. 9, shows the profile while FIG. 10 showing the rotated substrate in which the (110) facet (plane) is present instead of the (111) facet (plane) as in FIGS. 8 and 9.

After the HCL etching, there is a (100)-(111) facet (plane) profile. Maximum stress is expected and the inclined extension 72 is formed at an angle from normal to the first semiconductor material 43 layer in a range from 30-60°. In one example, the (111) facet (plane) forms a 54° angle with the (100) facet (plane) as the vertical plane. The etch rate for the various facets (planes) may be adjusted using temperature and pressure processing. In FIG. 8, the $T_{SI}$ (top surface imaging) is greater than 2 nm (nanometers) for good epitaxial regrowth. FIG. 9 shows the dimension scale at 500 nm (nanometers).

Figure 11:
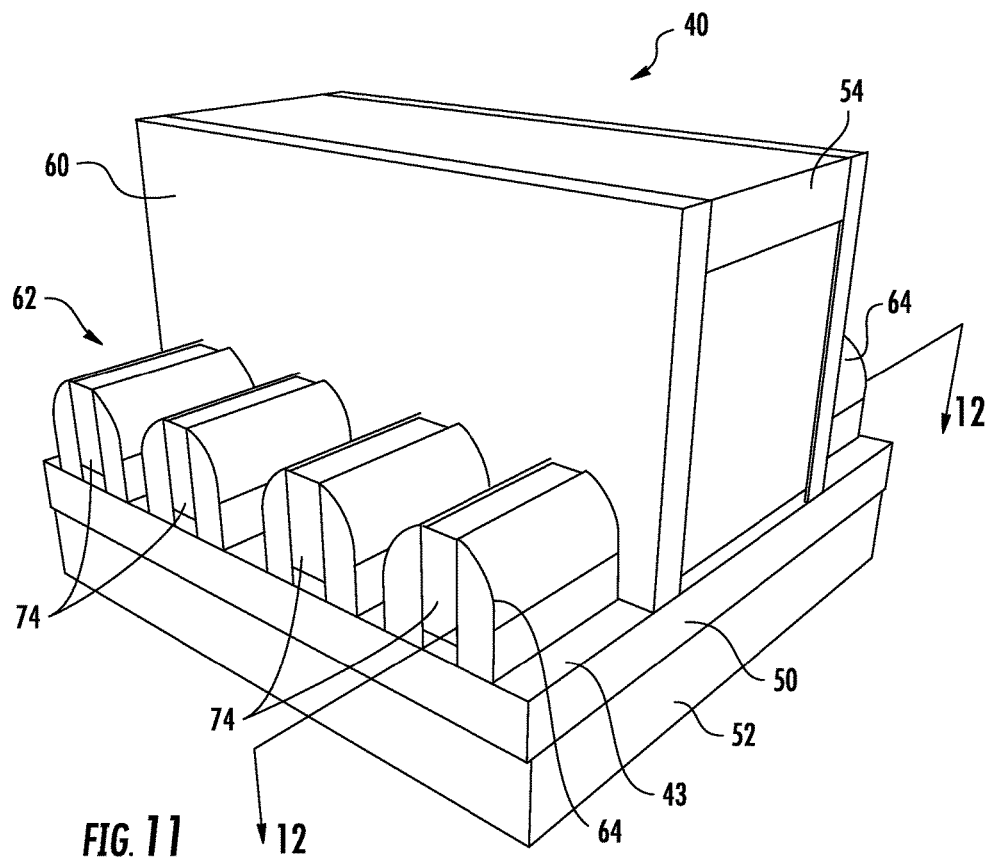
FIG. 11 is another perspective view showing a fourth processing step and the source and drain recesses filled with a second semiconductor material and where the first SiN spacer and second SiN spacer provide confinement during filling.

FIG. 11 is another isometric view showing the source and drain recesses 70 filled with the second semiconductor material 74 so that the first and second SiN spacers 60, 62 provide confinement during filling, such as the epitaxial material filling.

Figure 12:
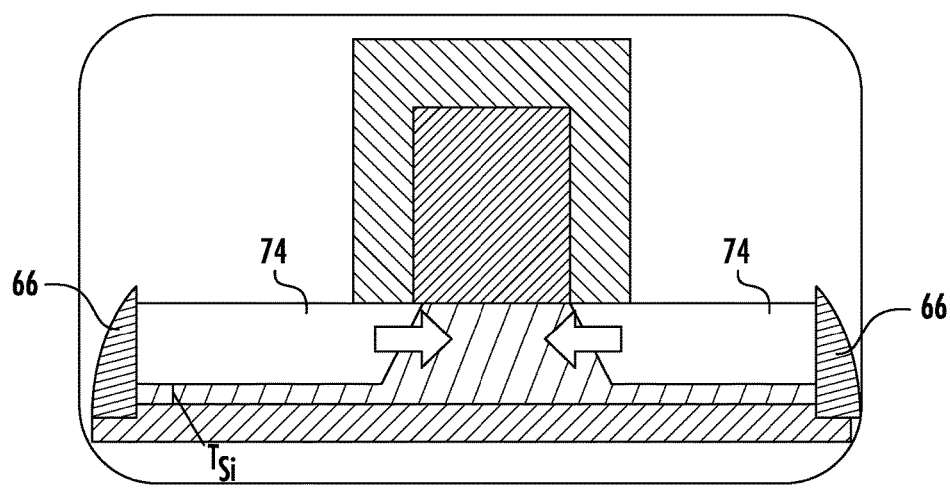
FIG. 12 is a cross-sectional view taken along line 12-12 in FIG. 11 and showing the inclined extension adjacent the at least one gate stack at source and drain regions.

FIG. 12 is a sectional view taken along line 12-12 of FIG. 11 and showing the source and drain regions 44 adjacent the at least one gate stack 46 filled with the second semiconductor material 74, which in one example, is a silicon germanium boron (SiGe)B. The etching and epitaxial growth is performed in the same processing chamber as an epitaxial reactor in a non-limiting example. The crystalline quality of the crystal, whether SiGe or SiC, provides a pure surface with the epitaxial growth imparting in one example compressive strain as indicated by the arrows in FIG. 12 and confined by the nitride spacers 60, 62 in all directions. The filler epitaxial material forms an extension that can be engineered by the epitaxial growth. In an example, an in-situ doped epitaxy is used for junction engineering with multi-layers of SiGeC:B/SiGe:B possible to maximize strain while maintaining good transistor electrostatics.

Shape creation for the source and drain recesses 70 occurs in the same processing chamber, for example, the epitaxial reactor. The wafer is loaded and the epitaxial reactor is set for depth and an etch temperature processing between 650° to 800° C. in one non-limiting example and at a pressure from 5 TORR to about 500 TORR. Deposition occurs with Si, SiGe, SiC and other precursors: Silicon Dichlorosilane SiH2Cl2 (as the silicon precursor), Germanium Germane (GeH4), and Carbon Methylsilane (CH3—SiH3). Doping may occur with Boron Diborane (B2H6), Phosphorous Phosphine (PH3), and Arsenic Arsine (ASH3).

Etching may occur with HCL (Hydrochloric Acid) at a flow from 100 SCCM (standard cubic centimeters per minute) to 20 SLM (standard liters per minute) to shape the source and drain recesses 70 and form the inclined extension 72 adjacent the gate stack 46 such as shown in FIG. 8.

The epitaxially deposited layer is typically Silicon Germanium with the germanium content ranging from about 25% to about 60% to impart stress. The same range of pressures may be applied in the same processing chamber as an epitaxy reactor with the pressures ranging from about 5 TORR to about 500 TORR and the temperature ranging from about 500° C. to about 800° C. Deposition may occur with Si, SiGe precursors as noted before and doping may occur with the same dopants as noted before.

Figure 13:
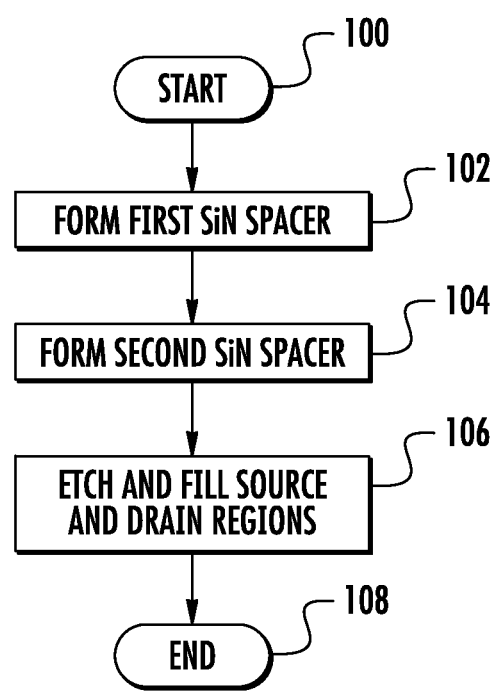
FIG. 13 is a flowchart illustrating a method for making the semiconductor device in accordance with a non-limiting example of the present invention.

FIG. 13 illustrates a high-level flowchart showing basic sequence steps. The process starts (block 100) and a first SiN spacer is formed (block 102) such as for at least one gate stack on a first semiconductor material layer. A respective second SiN spacer is formed (block 104) such as for each of source and drain regions in the first semiconductor layer and adjacent the at least one gate. The second SiN spacer is formed as a pair of opposing sidewalls and an end wall coupled thereto. The source and drain regions are filled with the second semiconductor material (block 106) such that the first SiN spacer and second SiN spacer provide confinement during filling. The process ends at block 108.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A semiconductor device, comprising:
a substrate including a first semiconductor material, the substrate including a first surface;
a plurality of semiconductor fins directly on the first surface of the substrate, each semiconductor fin having respective source and drain regions including a second semiconductor material and a medial portion between each source and drain region, each source region and each drain region having opposing first and second side surfaces and an end surface, the first surface of the substrate extends between adjacent ones of the semiconductor fins;
at least one gate stack overlying the medial portion of said semiconductor fins;
a first spacer directly on the first surface of the substrate and abutting the at least one gate stack; and
a plurality of second spacers directly on the first surface of the substrate, the second spacers abutting the first side surface, the second side surface, and the end surface of the source and drain regions of each of the semiconductor fins, each of the second spacers including:
a pair of opposing sidewalls that abut the first side surface and the second side surface of a respective source region or a respective drain region, and
an end wall that abuts the end surface of the respective source region or the respective drain region,
wherein the first and second semiconductor materials are different semiconductor materials.

2. The semiconductor device according to claim 1, wherein said first semiconductor material comprises silicon.

3. The semiconductor device according to claim 1, wherein said second semiconductor material comprises silicon and germanium.

4. The semiconductor device according to claim 1, wherein said first and second spacers comprise a nitride.

5. The semiconductor device according to claim 1, wherein the pair of opposing sidewalls of each second spacer is adjacent the at least one gate stack.

6. The semiconductor device according to claim 1, wherein said semiconductor device comprises a FinFET transistor.

7. A semiconductor device, comprising:
a substrate having a first surface;
a plurality of semiconductor fins extending from the first surface of the substrate, each semiconductor fin having a source region and a drain region, the source and drain regions including a first semiconductor material, and a medial portion extending between the source and drain regions, the medial portion including a second semiconductor material, the first surface of the substrate extends between adjacent ones of the semiconductor fins;
at least one gate stack overlying the medial portion of said semiconductor fins;
a first spacer directly on the first surface of the substrate and abutting the at least a plurality of second and abutting the at least one gate stack; and
a plurality of second spacers directly on the first surface of the substrate, the second spacers abut opposing first and second side surfaces and an end surface of each of the source regions and drain regions, the end surfaces being transverse to the first and second side surfaces and to the first surface of the substrate, each of the second spacers including:
a pair of opposing sidewalls that abut the first side surface and the second side surface of a respective source region or a respective drain region, and
an end wall that abuts the end surface of the respective source region or the respective drain region,
wherein the source and drain regions extend at least partially under the at least one gate stack, and the first and second semiconductor materials are different semiconductor materials.

8. The semiconductor device according to claim 7, wherein said source and drain regions have a faceted profile along the (111) plane.

9. The semiconductor device according to claim 7, wherein said source and drain regions have a recessed profile along the (110) plane.

10. The semiconductor device according to claim 7, wherein said second semiconductor material comprises silicon.

11. The semiconductor device according to claim 7, wherein said first semiconductor material comprises silicon and germanium.

12. The semiconductor device according to claim 7, wherein said first and second spacers comprise a nitride.

13. The semiconductor device according to claim 7, wherein the pair of opposing sidewalls of each second spacer is adjacent the at least one gate stack.

14. The semiconductor device according to claim 7, wherein said semiconductor device comprises a FinFET transistor.

15. A semiconductor device, comprising:
- a substrate including a first semiconductor material, the substrate including a first surface;
- a plurality of semiconductor fins on the first surface of the substrate, each semiconductor fin having a source region, a drain region and a medial portion between the source and drain regions, the source and drain regions including a second semiconductor material, the first surface of the substrate extends between adjacent ones of the semiconductor fins;
- at least one gate stack overlying the medial portion of said semiconductor fins;
- a first spacer directly on the first surface of the substrate and abutting the at least one gate stack; and
- a plurality of second spacers directly on the first surface of the substrate, the second spacers abut apposing first and second side surfaces and an end surface of each of the source regions and drain regions, each of the second spacers including:
  - a pair of opposing sidewalls that abut the first side surface and the second side surface of a respective source region or a respective drain region, and
  - an end wall that abuts the end surface of the respective source region or the respective drain region, the end surfaces being transverse to the first and second side surfaces,
- wherein the source and drain regions include an inclined extension adjacent the at least one gate stack, and the first and second semiconductor materials are different semiconductor materials.

16. The semiconductor device according to claim 15, wherein said inclined extension has an angle from normal to the substrate in a range from 30 to 60 degrees.

17. The semiconductor device according to claim 15, wherein said first semiconductor material comprises silicon.

18. The semiconductor device according to claim 15, wherein said second semiconductor material comprises silicon and germanium.

19. The semiconductor device according to claim 15, wherein said first and second spacers comprise a nitride.

20. The semiconductor device according to claim 15, wherein the pair of opposing sidewalls of each second spacer is adjacent the at least one gate stack.

21. The semiconductor device according to claim 15, wherein said semiconductor device comprises a FinFET transistor.

22. The semiconductor device according to claim 1 wherein the first spacer covers an entire sidewall of the at least one gate stack.

* * * * *

UNITED STATES PATENT AND TRADEMARK OFFICE
CERTIFICATE OF CORRECTION

PATENT NO.        : 10,205,022 B2
APPLICATION NO.   : 14/939729
DATED             : February 12, 2019
INVENTOR(S)       : Nicolas Loubet Page 1 of 1

It is certified that error appears in the above-identified patent and that said Letters Patent is hereby corrected as shown below:

On the Title Page

Item (56), References Cited, U.S. Patent Documents:
"8,313,999 B2* 11/2012 Cappellani" should read, --8,313,999 B2* 11/2012 Cappellani et al.--.

In the Claims

Column 6, Lines 41-42:
"and abutting the at least a plurality of second and abutting the at least one gate stack; and" should read, --and abutting the at least one gate stack; and--.

Column 7, Line 27:
"of the substrate, the second spacers abut apposing first" should read, --of the substrate, the second spacers abut opposing first--.

Signed and Sealed this
Thirtieth Day of April, 2019

Andrei Iancu
*Director of the United States Patent and Trademark Office*